United States Patent
Sasaki

(10) Patent No.: US 12,063,872 B2
(45) Date of Patent: Aug. 13, 2024

(54) MAGNETIC ELEMENT, MAGNETIC MEMORY, RESERVOIR ELEMENT, RECOGNIZER, AND METHOD FOR MANUFACTURING MAGNETIC ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 652 days.

(21) Appl. No.: 17/282,647

(22) PCT Filed: Apr. 8, 2019

(86) PCT No.: PCT/JP2019/015281
§ 371 (c)(1),
(2) Date: Apr. 2, 2021

(87) PCT Pub. No.: WO2020/208674
PCT Pub. Date: Oct. 15, 2020

(65) Prior Publication Data
US 2021/0351341 A1    Nov. 11, 2021

(51) Int. Cl.
H10N 52/80 (2023.01)
H10B 61/00 (2023.01)
H10N 50/01 (2023.01)

(52) U.S. Cl.
CPC ............. *H10N 52/80* (2023.02); *H10B 61/22* (2023.02); *H10N 50/01* (2023.02)

(58) Field of Classification Search
CPC ......... H10N 50/01; H10N 52/80; H10B 61/22
See application file for complete search history.

(56) References Cited

U.S. PATENT DOCUMENTS

| 8,350,347 B2 | 1/2013 | Gaudin et al. |
| 2004/0052127 A1* | 3/2004 | Suzuki ............ G11C 11/15 257/E21.665 |
| 2005/0063223 A1* | 3/2005 | Tran ................ G11C 11/15 365/171 |

(Continued)

FOREIGN PATENT DOCUMENTS

| CN | 108292702 A | 7/2018 |
| CN | 109427964 A | 3/2019 |

(Continued)

OTHER PUBLICATIONS

S.Fukami et al., "A Spin-Orbit Torque Switching Scheme With Collinear Magnetic Easy Axis and Current Configuration", Nature Nanotechnology, 11, 621, (2016), pp. 1-6.

(Continued)

*Primary Examiner* — Shaun M Campbell
(74) *Attorney, Agent, or Firm* — Oliff PLC

(57) ABSTRACT

A magnetic element includes a first ferromagnetic layer, and a first wiring that faces the first ferromagnetic layer in a first direction. The first wiring has a wiring portion extending in a second direction different from the first direction, and a wide width portion having a wider width than the wiring portion in a third direction intersecting the second direction when viewed from the first direction. A center position of the wiring portion in the third direction and a center position of the first ferromagnetic layer in the third direction are different from each other.

17 Claims, 9 Drawing Sheets

(56) References Cited

U.S. PATENT DOCUMENTS

| | | | |
|---|---|---|---|
| 2010/0119875 A1 | 5/2010 | Sasaki | |
| 2015/0348606 A1 | 12/2015 | Buhrman et al. | |
| 2016/0181512 A1* | 6/2016 | Ahn | H10N 50/10 257/421 |
| 2017/0222135 A1 | 8/2017 | Fukami et al. | |
| 2018/0123021 A1* | 5/2018 | Sasaki | H10N 50/85 |
| 2018/0174635 A1 | 6/2018 | Yoda et al. | |
| 2018/0277744 A1* | 9/2018 | Toko | H10N 50/85 |
| 2018/0277746 A1* | 9/2018 | Abe | G11C 11/1659 |
| 2018/0337326 A1 | 11/2018 | Sasaki | |
| 2019/0088395 A1 | 3/2019 | Ota et al. | |
| 2019/0130252 A1* | 5/2019 | Kanazawa | G06N 3/088 |

FOREIGN PATENT DOCUMENTS

| | | |
|---|---|---|
| JP | 2017-112365 A | 6/2017 |
| JP | 2017-216286 A | 12/2017 |
| JP | 2018-098468 A | 6/2018 |
| WO | 2016/021468 A1 | 2/2016 |

OTHER PUBLICATIONS

Y. K. Kato et al., "Observation of the Spin Hall Effect in Semiconductors", Science, 306, (2004), pp. 1910-1913.

I. M. Miron, et al., "Perpendicular Switching of a Single Ferromagnetic Layer Induced by In-Plane Current Injection", Nature, vol. 476, 189, 2011, pp. 190-193.

L. Liu et al., "Spin Torque Switching With the Giant Spin Hall Effect of Tantalum", Science, 336, 555, 2012, pp. 1-19 and 1-12.

L. Liu et al., "Current-Induced Switching of Perpendicularly Magnetized Magnetic Layers Using Spin Torque From the Spin Hall Effect", Physical Review Letters, 109, 096602, 2012.

KS. Lee et al., "Threshold Current for Switching of a Perpendicular Magnetic Layer Induced by Spin Hall Effect", Applied Physics Letters, 102, 112410, 2013.

KS. Lee et al., "Thermally Activated Switching of Perpendicular Magnet by Spin-Orbit Spin Torque", Applied Physics Letters, 104, 072413, 2014.

S. Fukami et al., "Magnetization Switching by Spin-Orbit Torque in an Antiferromagnet-Ferromagnet Bilayer System", Nature materials, 15, 535, 2016.

S. Takahashi et al., "Spin Injection and Detection in Magnetic Nanostructures", Physical Review B 67, 052409, 2003.

Y. Seo et al., "Area-Efficient SOT-MRAM With a Schottky Diode", IEEE Electron Device Letters, vol. 37, No. 8, p. 982, 2016.

W. Zhang et al., "Spin Hall Effects in Metallic Antiferromagnets", Physical Review Letters, 113, 196602 (2014).

H. Sato et al., "Perpendicular-Anisotropy CoFeB—MgO Magnetic Tunnel Junctions With a MgO/CoFeB/Ta/CoFeB/MgO Recording Structure", Applied Physics Letters 101,022414 (2012).

L. Liu et al., "Magnetic Oscillations Driven by the Spin Hall Effect in 3-Terminal Magnetic Tunnel Junction Devices", Physical Review Letters 109, 186602 (2012).

T. Kimura et al., "Electrical Control of the Direction of Spin Accumulation", Physical Review Letters, 99, 166601 (2007).

G. Yu et al., "Switching of Perpendicular Magnetization by Spin-Orbit Torques in the Absence of External Magnetic Fields", Nature Nanotechnology, DOI:10.1038/NNANO.2014.94, 2014.

Jun. 25, 2019 Search Report issued in International Patent Application No. PCT/JP2019/015281.

* cited by examiner

MAGNETIC ELEMENT, MAGNETIC MEMORY, RESERVOIR ELEMENT, RECOGNIZER, AND METHOD FOR MANUFACTURING MAGNETIC ELEMENT

BACKGROUND OF THE DISCLOSURE

Field of the Disclosure

The present disclosure relates to a magnetic element, a magnetic memory, a reservoir element, a recognizer, and a method for manufacturing a magnetic element.

Description of Related Art

Magnetoresistance effect elements are expected to be applied to magnetic sensors, high-frequency components, magnetic heads, and magnetic random access memories (MRAMs).

A magnetoresistance effect element outputs a change in a magnetization direction between two ferromagnetic layers having a non-magnetic layer interposed therebetween as a resistance change of an element. The magnetoresistance effect element controls the magnetization direction of the ferromagnetic layers and records data. Regarding a method for controlling a magnetization direction, a method of utilizing a magnetic field generated by a current, and a method of utilizing a spin transfer torque (STT) generated when a current flows in a lamination direction of a magnetoresistance effect element are known. In a method of utilizing an STT, there is a need to apply a potential difference in a direction in which a non-magnetic layer is penetrated, and therefore the non-magnetic layer may be damaged.

In recent years, a method of utilizing a spin-orbit torque (SOT) has been studied as a new method for controlling a magnetization direction (for example, Patent Document 1). An SOT is induced into a ferromagnetic layer due to a spin current generated by a spin-orbit interaction or a Rashba effect in an interface between different materials. When an SOT acts on magnetization inside a ferromagnetic layer, magnetization is reversed. A spin current and a Rashba effect are caused when a current flows in a direction intersecting a lamination direction of a ferromagnetic layer. In a method of utilizing an SOT, a large write current flowing in the lamination direction of a non-magnetic layer and a ferromagnetic layer can be avoided, and damage to the non-magnetic layer or the like can be curbed.

On the other hand, regarding a write method using an SOT, it is said that there is a need to disturb the symmetry of magnetization of magnetization reversal by means of an external magnetic field depending on the constitution of an element (for example, Non-Patent Document 1). For example, when magnetization of a ferromagnetic layer is oriented in a lamination direction (z direction) of the ferromagnetic layer, it is required to apply a magnetic field in a direction in which a wiring extends (x direction).

PATENT DOCUMENTS

[Patent Document 1] Japanese Unexamined Patent Application, First Publication No. 2017-216286

Non-Patent Document

[Non-Patent Document 1] S. Fukami, T. Anekawa, C. Zhang, and H. Ohno, Nature Nanotechnology, DO1: 10.1038/NNANO.2016.29.

SUMMARY OF THE DISCLOSURE

If a generation source of an external magnetic field is provided separately, the size of an element becomes large and a manufacturing process becomes complicated. Depending on the constitution of an element, magnetization reversal can be performed without applying an external magnetic field, but there is a problem that an inversion current density is large.

The present disclosure has been made in consideration of the foregoing circumstances, and an object thereof is to provide a magnetic element in which magnetization reversal can be easily performed, a magnetic memory, a reservoir element, a recognizer, and a method for manufacturing a magnetic element.

In order to solve the foregoing problems, the present disclosure provides the following means.

(1) According to a first aspect, there is provided a magnetic element including a first ferromagnetic layer, and a first wiring that faces the first ferromagnetic layer in a first direction. The first wiring has a wiring portion extending in a second direction different from the first direction, and a wide width portion having a wider width than the wiring portion in a third direction intersecting the second direction when viewed from the first direction. A center position of the wiring portion in the third direction and a center position of the first ferromagnetic layer in the third direction are different from each other.

(2) The magnetic element according to the foregoing aspect may further include a cap layer that faces a first region which does not overlap on the wiring portion of the wide width portion when viewed from the first direction. The cap layer may be any of oxide, nitride, sulfide, and fluoride including an element constituting the wide width portion.

(3) In the magnetic element according to the foregoing aspect, a spin resistance of the wide width portion may be equal to or lower than a spin resistance of the wiring portion.

(4) In the magnetic element according to the foregoing aspect, the wide width portion may include a second region which overlaps on the first region which does not overlap on the wiring portion. A thickness of the second region may be smaller than a thickness of the first region.

(5) In the magnetic element according to the foregoing aspect, the wiring portion may have a first part and a second part which are separated from each other in the second direction when viewed from the first direction.

(6) The magnetic element according to the foregoing aspect may further include a first magnetic substance and a second magnetic substance that have the first ferromagnetic layer interposed therebetween in at least one of the second direction and the third direction.

(7) In the magnetic element according to the foregoing aspect, the first wiring may include any of a metal, an alloy, an intermetallic compound, metal boride, metal carbide, metal silicate, and metal phosphide having a function of generating a spin current due to a spin Hall effect occurring when a current flows.

(8) The magnetic element according to the foregoing aspect may further include a second ferromagnetic layer that is positioned on a side opposite to the first wiring of the first ferromagnetic layer, and a nonmagnetic layer that is positioned between the first ferromagnetic layer and the second ferromagnetic layer.

(9) According to a second aspect, there is provided a magnetic memory including the magnetic elements according to the aspect, and wirings that are respectively connected to the plurality of magnetic elements.

(10) According to a third aspect, there is provided a reservoir element including the magnetic element according to the aspect, and a spin diffusion layer that connects the first ferromagnetic layers of the plurality of magnetic elements.

(11) According to a fourth aspect, there is provided a recognizer including the reservoir element according to the aspect, and a plurality of sensors that are configured to input data to the reservoir element.

(12) According to the fourth aspect, there is provided a method for manufacturing a magnetic element including a step of forming a mask layer which is configured to be dissolvable in a portion of a lamination film, a step of processing a lamination film via the mask layer and forming a magnetoresistance effect element, a step of forming an insulating layer around the mask layer and the magnetoresistance effect element, and a step of removing the mask layer and forming a conductive layer in a portion of a part from which the mask layer is removed.

(13) In the method for manufacturing a magnetic element according to the third aspect, the mask layer may be any one selected from the group consisting of Si, $SiO_2$, $Al_2O_3$, and a resist.

According to the magnetic element, the magnetic memory, the reservoir element, and the recognizer of the foregoing aspects, magnetization of a magnetic layer can be easily reversed. In addition, according to the method for manufacturing a magnetic element of the foregoing aspect, a magnetic element capable of easily reversing magnetization of a magnetic layer can be easily produced in an industrial manner.

DETAILED DESCRIPTION OF THE DISCLOSURE

Hereinafter, the present embodiment will be described in detail with reference to the drawings as necessary. In drawings used in the following description, in order to make characteristics easy to understand, characteristic portions may be illustrated in an enlarged manner for the sake of convenience, and dimensional ratios or the like of each constituent element may differ from actual values thereof. Exemplary materials, dimensions, and the like provided in the following description are merely examples. The present disclosure is not limited thereto and can be suitably changed and performed within a range in which the effects of the present disclosure are exhibited.

First, directions will be defined. A positive x direction is a direction in which a first wiring 20 (which will be described below) extends. A negative x direction is a direction opposite to the positive x direction. When the positive x direction and the negative x direction are not distinguished from each other, they will be simply referred to as "an x direction". The x direction is an example of a second direction. A positive y direction is a direction orthogonal to the x direction. A negative y direction is a direction opposite to the positive y direction. When the positive y direction and the negative y direction are not distinguished from each other, they will be simply referred to as "a y direction". The y direction is an example of a third direction. A positive z direction is a direction in which layers of a magnetoresistance effect element 10 (which will be described below) are laminated. A negative z direction is a direction opposite to the positive z direction. When the positive z direction and the negative z direction are not distinguished from each other, they will be simply referred to as "a z direction". The z direction is an example of a first direction. Hereinafter, the positive z direction may be expressed as "upward", and the negative z direction may be expressed as "downward". The upward and downward directions do not necessarily coincide with a direction in which a gravitational force is applied.

For example, in this specification, "extending in the x direction" denotes that a dimension in the x direction is larger than the smallest dimension of the dimensions in the x direction, the y direction, and the z direction. The same applies to cases of extending in other directions. In this specification, "connect" is not limited to a case of being physically connected and also includes a case of being electrically connected. In this specification, "facing" is not limited to a case where two members are in contact with each other and also includes a case where another member is present between two members.

First Embodiment

Figure 1:
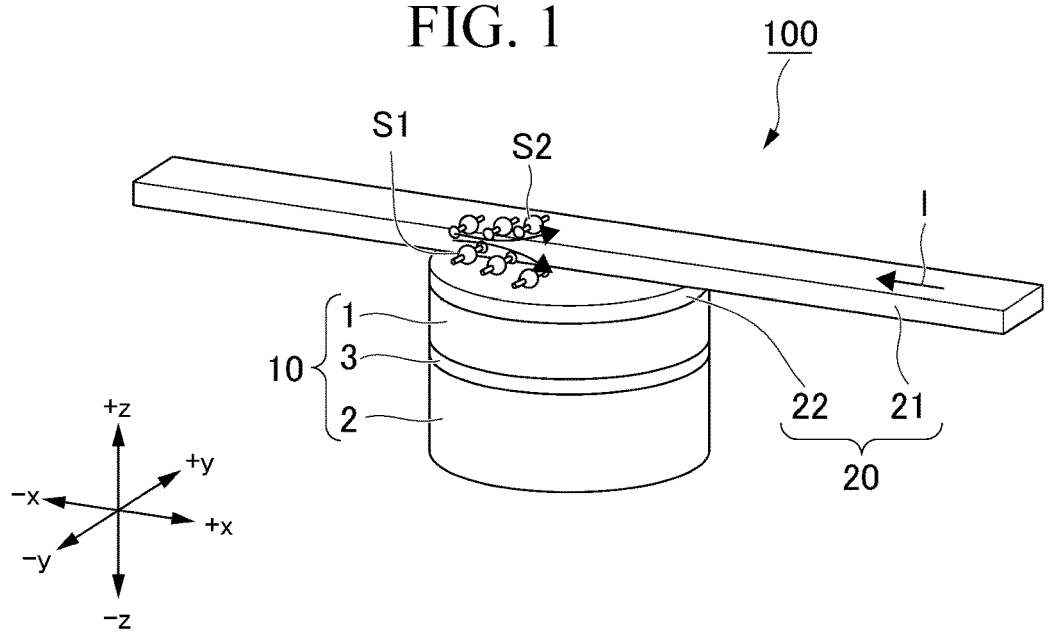
FIG. 1 is a perspective view of a magnetic element according to a first embodiment.
Figure 2:
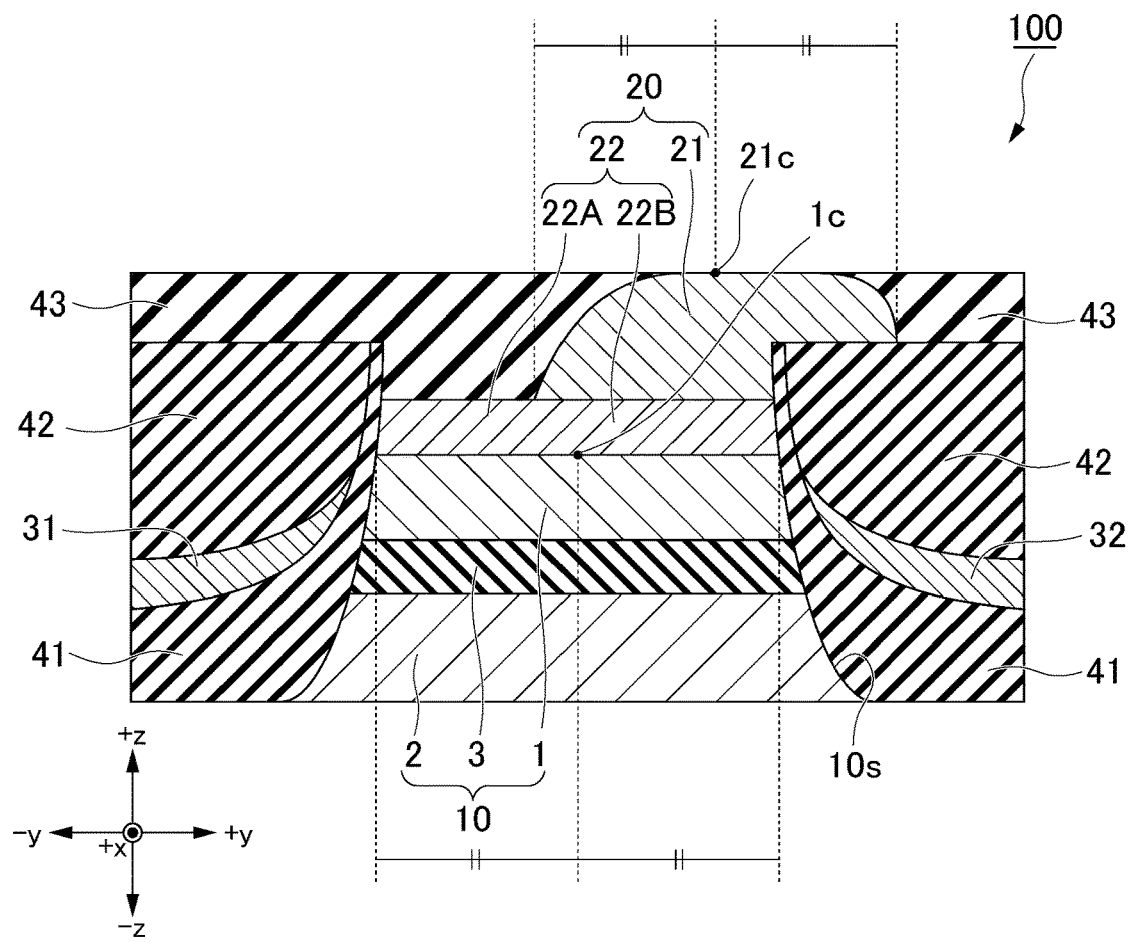
FIG. 2 is a cross-sectional view of the magnetic element according to the first embodiment.
Figure 3:
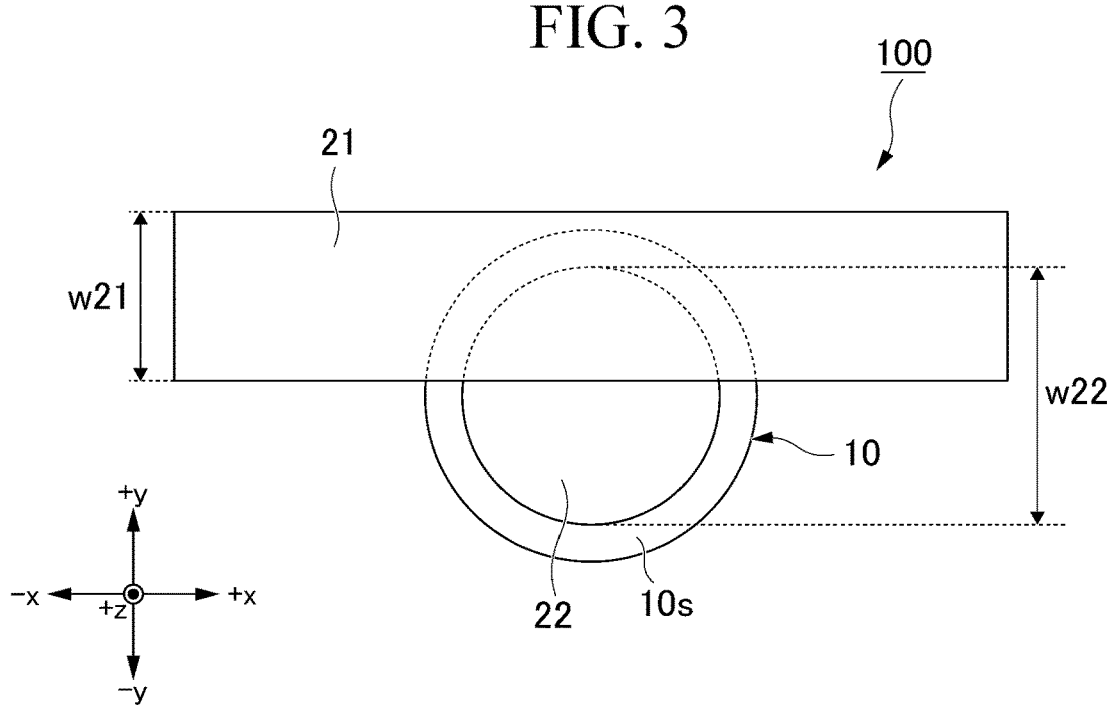
FIG. 3 is a plan view of the magnetic element according to the first embodiment.

FIG. 1 is a perspective view of a magnetic element 100 according to a first embodiment. FIG. 2 is a cross-sectional view of the magnetic element 100 according to the first embodiment. FIG. 2 is a cross-sectional view of the magnetic element 100 cut along a yz plane passing through the center of the magnetoresistance effect element 10 in the x direction. FIG. 3 is a plan view of the magnetic element 100 according to the first embodiment.

For example, the magnetic element 100 has the magnetoresistance effect element 10, the first wiring 20, a first magnetic substance 31, a second magnetic substance 32, and insulating layers 41, 42, and 43. The magnetic element 100 is an element performing magnetization rotation utilizing a spin-orbit torque (SOT) and may be referred to as a spin-orbit-torque magnetization rotational element, a spin-orbit-torque magnetization reversal element, or a spin-orbit torque magnetoresistance effect element. The magnetic element 100 may function as a storage element which stores information in accordance with a magnetization orientation direction.

The magnetoresistance effect element 10 faces the first wiring 20. For example, the magnetoresistance effect element 10 is a circular columnar body in a plan view in the z direction. The shape of the magnetoresistance effect element 10 in a plan view in the z direction is not limited to a circular shape. For example, it may have an ellipsoidal shape, a rectangular shape, or the like. For example, the outer circumferential length or the diameter of the magnetoresistance effect element 10 increases as the distance from the first wiring 20 increases. For example, a side surface 10s of the magnetoresistance effect element 10 is inclined in the x direction or the y direction with respect to the z direction.

The magnetoresistance effect element 10 has a first ferromagnetic layer 1, a second ferromagnetic layer 2, and a non-magnetic layer 3. The first ferromagnetic layer 1 faces the first wiring 20. The second ferromagnetic layer 2, for example, faces an electrode 60 (which will be described below) (refer to FIG. 14). The non-magnetic layer 3 is interposed between the first ferromagnetic layer 1 and the second ferromagnetic layer 2.

Each of the first ferromagnetic layer 1 and the second ferromagnetic layer 2 has magnetization. In magnetization of the second ferromagnetic layer 2, an orientation direction is less likely to change than that in the magnetization of the first ferromagnetic layer 1 when a predetermined external force is applied. The first ferromagnetic layer 1 may be referred to as a magnetization free layer, and the second ferromagnetic layer 2 may be referred to as a magnetization fixed layer or a magnetization reference layer. In the magnetoresistance effect element 10, a resistance value varies in accordance with a difference between relative angles of the magnetization of the first ferromagnetic layer 1 and the magnetization of the second ferromagnetic layer 2 having the non-magnetic layer 3 interposed therebetween. For example, the magnetization of the first ferromagnetic layer 1 and the second ferromagnetic layer 2 is oriented in the z direction or any direction within an xy plane.

The first ferromagnetic layer 1 and the second ferromagnetic layer 2 include a ferromagnetic substance. A ferromagnetic substance is, for example, a metal selected from the group consisting of Cr, Mn, Co, Fe, and Ni, an alloy including one or more of these metals, and an alloy including any of these metals, and at least one or more element of B, C, and N. For example, a ferromagnetic substance is a Co—Fe, Co—Fe—B, Ni—Fe, or Co—Ho alloy, a Sm—Fe alloy, a Fe—Pt alloy, a Co—Pt alloy, or a CoCrPt alloy.

The first ferromagnetic layer 1 and the second ferromagnetic layer 2 may include a Heusler alloy. A Heusler alloy includes an intermetallic compound having a chemical composition of XYZ or $X_2YZ$. X represents a Co-, Fe-, Ni-, or Cu-group transition metal element in the periodic table or a noble metal element. Y represents a Mn-, V-, Cr-, or Ti-group transition metal or an element represented by X. Z is a typical element of a III-group to a V-group. A Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. A Heusler alloy has a high spin polarization.

The magnetoresistance effect element 10 may have an antiferromagnetic layer on a surface of the second ferromagnetic layer 2 on a side opposite to the non-magnetic layer 3 with a spacer layer therebetween. The second ferromagnetic layer 2, the spacer layer, and the antiferromagnetic layer constitute a synthetic antiferromagnetic structure (SAF structure). The synthetic antiferromagnetic structure is constituted of two magnetic layers having a non-magnetic layer interposed therebetween. Due to antiferromagnetic coupling of the second ferromagnetic layer 2 and the antiferromagnetic layer, the second ferromagnetic layer 2 has a large coercivity compared to a case of having no antiferromagnetic layer. The antiferromagnetic layer, for example, has IrMn, PtMn, and the like. For example, the spacer layer includes at least one selected from the group consisting of Ru, Ir, and Rh.

The magnetoresistance effect element 10 may have another layer in addition to the first ferromagnetic layer 1, the second ferromagnetic layer 2, and the non-magnetic layer 3.

The first wiring 20 extends in the x direction. The first wiring 20, for example, has a larger length in the x direction than in the y direction when viewed from the z direction. The first wiring 20 faces the first ferromagnetic layer 1 of the magnetoresistance effect element 10. The first ferromagnetic layer 1 is interposed between at least a portion of the first wiring 20 and the non-magnetic layer 3 in the z direction.

The first wiring 20 includes any of a metal, an alloy, an intermetallic compound, metal boride, metal carbide, metal silicate, and metal phosphide having a function of generating a spin current due to the spin Hall effect occurring when a current I flows. The first wiring 20 may be referred to as a spin-orbit torque wiring.

The spin Hall effect is a phenomenon in which a spin current is induced in a direction orthogonal to a flowing direction of a current on the basis of a spin-orbit interaction occurring when a current flows. The spin Hall effect and a normal Hall effect are the same in that a movement (traveling) direction of moving (traveling) charges (electrons) is bent. The normal Hall effect and the spin Hall effect differ in that, in the normal Hall effect, charged particles moving in a magnetic field are subjected to a Lorentz force and a moving direction of the charged particles is bent, whereas in the spin Hall effect, a traveling direction of a spin is bent only due to moving electrons (only due to a flowing current) even though a magnetic field is absent.

The first wiring 20 generates a spin current due to the spin Hall effect occurring when the current I flows. If the current I flows in the first wiring 20, each of a first spin S1 oriented in one direction and a second spin S2 oriented in a direction opposite to the first spin S1 is bent in a direction orthogonal to the flowing direction of the current I due to the spin Hall effect. For example, the first spin S1 oriented in the positive y direction is bent in the negative z direction, and the second spin S2 oriented in the negative y direction is bent in the positive z direction.

In a non-magnetic substance (a material which is not a ferromagnetic substance), the number of electrons in the first spin S1 and the number of electrons in the second spin S2 generated due to the spin Hall effect are equivalent to each other. That is, the number of electrons in the first spin S1 toward the negative z direction and the number of electrons in the second spin S2 toward the positive z direction are equivalent to each other. The first spin S1 and the second spin S2 flow in a direction in which uneven distribution of a spin is eliminated. Since a flow of charges cancel each other when the first spin S1 and the second spin S2 travel in the z direction, the current amount becomes zero. A spin current without a current is particularly referred to as a pure spin current.

When a flow of electrons in the first spin S1 is expressed as $J_\uparrow$, a flow of electrons in the second spin S2 is expressed as $J_\downarrow$, and a spin current is expressed as $J_S$, they are defined $J_S = J_\uparrow - J_\downarrow$. The spin current $J_S$ is generated in the z direction. The first spin S1 is implanted into the first ferromagnetic layer 1 facing the first wiring 20. The first wiring 20, for example, applies as much an SOT to the magnetization of the first ferromagnetic layer 1 as the magnetization of the first ferromagnetic layer 1 can be reversed.

The first wiring 20 has a wiring portion 21 and a wide width portion 22. The wiring portion 21 is a portion of the first wiring 20. The wiring portion 21 extends in the x direction. For example, the wiring portion 21 connects two via wirings Cw to each other (refer to FIG. 14). For example, a side surface of the wiring portion 21 in the y direction is inclined with respect to the z direction.

The wide width portion 22 is, for example, positioned between the wiring portion 21 and the first ferromagnetic layer 1 in the z direction. A width w22 of the wide width portion 22 in the y direction is wider than a width w21 of the wiring portion 21 when viewed from the z direction. The width w21 of the wiring portion 21 in the y direction is substantially uniform regardless of a position in the x direction. The wide width portion 22 projects in the y direction in a plan view from the z direction. The wide width portion 22 is, for example, at a position overlapping the magnetoresistance effect element 10 in the z direction. The wide width portion 22 has a first region 22A which does not overlap on the wiring portion 21 in a plan view in the z direction, and a second region 22B which overlaps on the wiring portion 21. The wiring portion 21 faces the second region 22B.

A center position 21c of the wiring portion 21 in the y direction differs from a center position 1c of the first ferromagnetic layer 1 in the y direction. The center positions 21c and 1c are centers of the widths in a plan view in the z direction. In addition, the center of gravity of the wiring portion 21 and the center of gravity of the first ferromagnetic layer 1 are at different positions in the y direction. The first wiring 20 is asymmetric in the y direction. The thickness of the first wiring 20 varies depending on a position in the y direction. The thickness of the first wiring 20 significantly changes at a boundary position between the first region 22A and the second region 22B in the y direction. A first surface of the first wiring 20 in the positive z direction has a step (inflection point) at a boundary position between the first region 22A and the second region 22B in the y direction.

It is preferable that a main composition of the first wiring 20 be a non-magnetic heavy metal. A heavy metal denotes a metal having a specific weight equal to or larger than that of yttrium (Y). It is preferable that a non-magnetic heavy metal be a non-magnetic metal of a high atomic number (atomic number 39 or higher) having d electrons or f electrons in an outermost shell in some embodiments. For example, the first wiring 20 has Hf, Ta, and W. In a non-magnetic heavy metal, a spin-orbit interaction stronger than that in other metals occurs. The spin Hall effect occurs due to a spin-orbit interaction. A spin is likely to be unevenly distributed inside the first wiring 20, and the spin current $J_S$ is likely to be generated.

The first wiring 20 may include a magnetic metal. A magnetic metal is a ferromagnetic metal or an antiferromagnetic metal. A slight amount of a magnetic metal included in a non-magnetic substance becomes a scattering factor of spins. For example, a slight amount indicates an amount equal to or less than 3% of the total mole ratio of an element constituting the first wiring 20. When a spin scatters due to a magnetic metal, a spin-orbit interaction is enhanced, and thus generation efficiency of a spin current with respect to a current increases.

The first wiring 20 may include a topological insulator. The topological insulator is a substance in which the interior of the substance is an insulator or a high resistance body and a spin-polarized metal state is generated on its surface. In the topological insulator, an internal magnetic field is generated due to a spin-orbit interaction. In the topological insulator, a new topological phase develops due to the effect of the spin-orbit interaction even in the case where there is no external magnetic field. The topological insulator can generate a pure spin current with high efficiency due to a strong spin-orbit interaction and breaking of inversion symmetry at an edge.

The topological insulator is, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$ and the like. The topological insulator can generate a spin current with high efficiency.

The wiring portion 21 and the wide width portion 22 may include different materials. A spin resistance of the wide width portion 22 is, for example, equal to or lower than a spin resistance of the wiring portion 21. A spin resistance is a quantity quantitatively indicating a degree of ease of a flow of a spin current (a degree of difficulty in relaxing a spin). A spin resistance Rs is defined by $Rs = \rho\lambda/A$. $\lambda$ indicates a spin diffusion length of the material, $\rho$ indicates an electric resistivity of the material, and A indicates a cross-sectional area of the material. In a non-magnetic substance, when the cross-sectional area A is the same, the magnitude of a spin resistance is determined based on the value of $\rho\lambda$ which represents the spin resistivity.

In an interface between substances having different spin resistances, reflection (return) of a spin current occurs. That is, only a portion of a spin current is implanted into a material having a large spin resistance from a material having a small spin resistance. When the spin resistance of the wide width portion 22 is smaller than the spin resistance of the wiring portion 21, a spin can be efficiently supplied to the first ferromagnetic layer 1.

In addition, for example, the wiring portion 21 and the wide width portion 22 have different polarities of a spin Hall angle. "a spin Hall angle" is one of indices for an intensity of the spin Hall effect and indicates the conversion efficiency of a spin current generated with respect to a current flowing along the first wiring 20. When the polarity of a spin Hall angle differs, the traveling directions of the first spin S1 and the second spin S2 in the z direction become opposite to each other. The efficiency of implanting a spin into the first ferromagnetic layer 1 can be enhanced by bringing substances having different polarities of a spin Hall angle into contact with each other.

The first magnetic substance 31 and the second magnetic substance 32 are positions having the first ferromagnetic layer 1 interposed therebetween in at least one of the x direction and the y direction. The first magnetic substance 31 and the second magnetic substance 32 include a magnetic body. For example, the first magnetic substance 31 and the second magnetic substance 32 are permanent magnets and are alloys of Co—Cr—Pt, Nd—Fe—B, Sm—Co, Ho—Fe, or Sm—Fe, or ferromagnetic oxide of ferrite or the like, for example. A magnetic field is generated between the first magnetic substance 31 and the second magnetic substance 32. When the first magnetic substance 31 and the second magnetic substance 32 have the first ferromagnetic layer 1 interposed therebetween in the x direction, the first magnetic substance 31 and the second magnetic substance 32 apply a magnetic field in the x direction of the first ferromagnetic layer 1. When the first magnetic substance 31 and the second magnetic substance 32 have the first ferromagnetic layer 1 interposed therebetween in the y direction, the first magnetic substance 31 and the second magnetic substance 32 apply a magnetic field in the y direction of the first ferromagnetic layer 1.

The first magnetic substance 31 and the second magnetic substance 32 are examples of a magnetic field applying unit for applying a magnetic field to the first ferromagnetic layer 1. The magnetic field applying unit need only be able to apply a magnetic field to the first ferromagnetic layer 1 and is not limited to the first magnetic substance 31 and the second magnetic substance 32. For example, the magnetic field applying unit may be an electromagnetic type or a stripline type which can perform variable control of the intensity of an applying magnetic field. In addition, an electric field may be applied to the first ferromagnetic layer 1 in place of a magnetic field.

The insulating layers 41, 42, and 43 are insulating layers for insulating wirings or elements from each other in a multi-layer wiring. For example, the insulating layers 41, 42, and 43 include silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), and the like.

Next, a method for manufacturing the magnetic element 100 will be described. The method for manufacturing the magnetic element 100 has a step of forming a mask layer which is dissolvable in a portion of a lamination film, a step of processing a lamination film via the mask layer and forming a magnetoresistance effect element, a step of forming an insulating layer around the mask layer and the magnetoresistance effect element, and a step of removing the mask layer and forming a conductive layer in a portion of a part from which the mask layer is removed.

Figure 4:
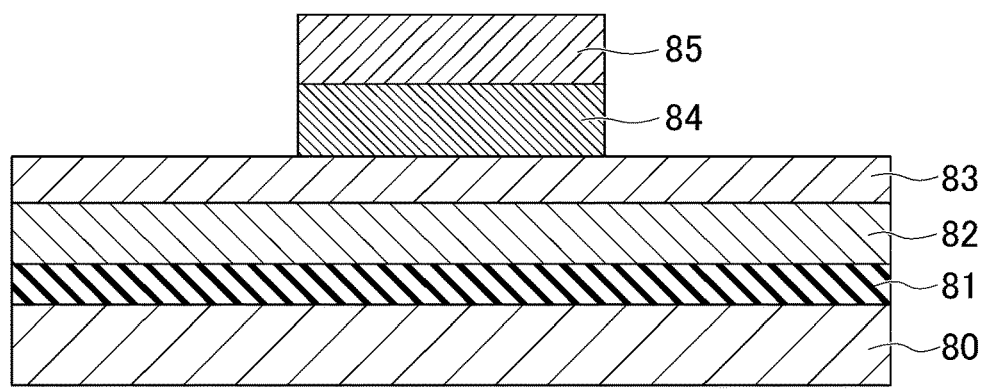
FIG. 4 is a cross-sectional view for describing a method for manufacturing a magnetic element according to the first embodiment.

First, as illustrated in FIG. 4, a laminated body is laminated by laminating a ferromagnetic layer 80, a non-magnetic layer 81, a ferromagnetic layer 82, and a conductive layer 83 in sequence. For example, a sputtering method, a chemical vapor deposition method, or the like is used for film formation of each of the above layers. The ferromagnetic layer 80 is a layer which becomes a base of the second ferromagnetic layer 2, the non-magnetic layer 81 is a layer which becomes a base of the non-magnetic layer 3, the ferromagnetic layer 82 is a layer which becomes a base of the first ferromagnetic layer 1, and the conductive layer 83 is a layer which becomes a base of the wide width portion 22 of the first wiring 20. The material of each of the layers is similar to the material of a formed film.

Next, a first mask 84 and a second mask 85 are laminated in sequence in a portion of the laminate. For example, a sputtering method, a chemical vapor deposition method, or the like is used for film formation of each of the above layers. The first mask 84 can dissolve in a chemical solution. For example, the first mask 84 is Si, $SiO_2$, $Al_2O_3$, and a resist. For example, the second mask 85 is Al, Cu, Ta, Ti, Zr, NiCr, nitride (for example, TiN, TaN, or SiN), and oxide (for example, $SiO_2$).

Figure 5:
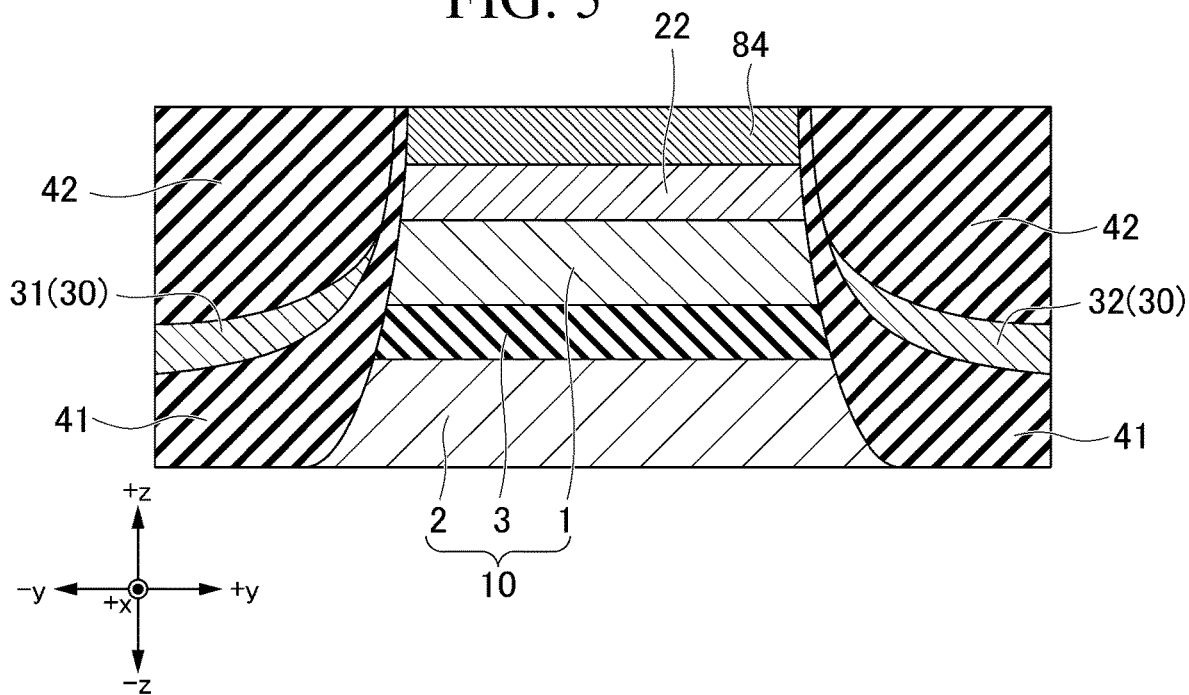
FIG. 5 is a cross-sectional view for describing the method for manufacturing a magnetic element according to the first embodiment.

Next, as illustrated in FIG. 5, the laminated body is processed via the first mask 84 and the second mask 85. The laminated body is, for example, processed through ion milling or the like. The second mask 85 is, for example, removed at the same time as the laminated body is processed. A portion of the second mask 85 may remain. When the second mask 85 remains, for example, the remaining second mask 85 is removed through chemical mechanical polishing (CMP). The laminated body becomes the magnetoresistance effect element 10 through processing. The size of the magnetoresistance effect element 10 within an xy plane is micronized using the first mask 84 and the second mask 85. The magnetoresistance effect element 10 and the wide width portion 22 are processed into a circular shape or an ellipsoidal shape, for example, in a plan view in the z direction.

Next, as illustrated in FIG. 5, the insulating layer 41, a magnetic layer 30, and the insulating layer 42 are laminated in sequence around the magnetoresistance effect element 10, the wide width portion 22, and the first mask 84. The magnetic layer 30 becomes the first magnetic substance 31 and the second magnetic substance 32. The first magnetic substance 31 and the second magnetic substance 32 are electrically insulated from the magnetoresistance effect element 10 by the insulating layer 41.

Figure 6:
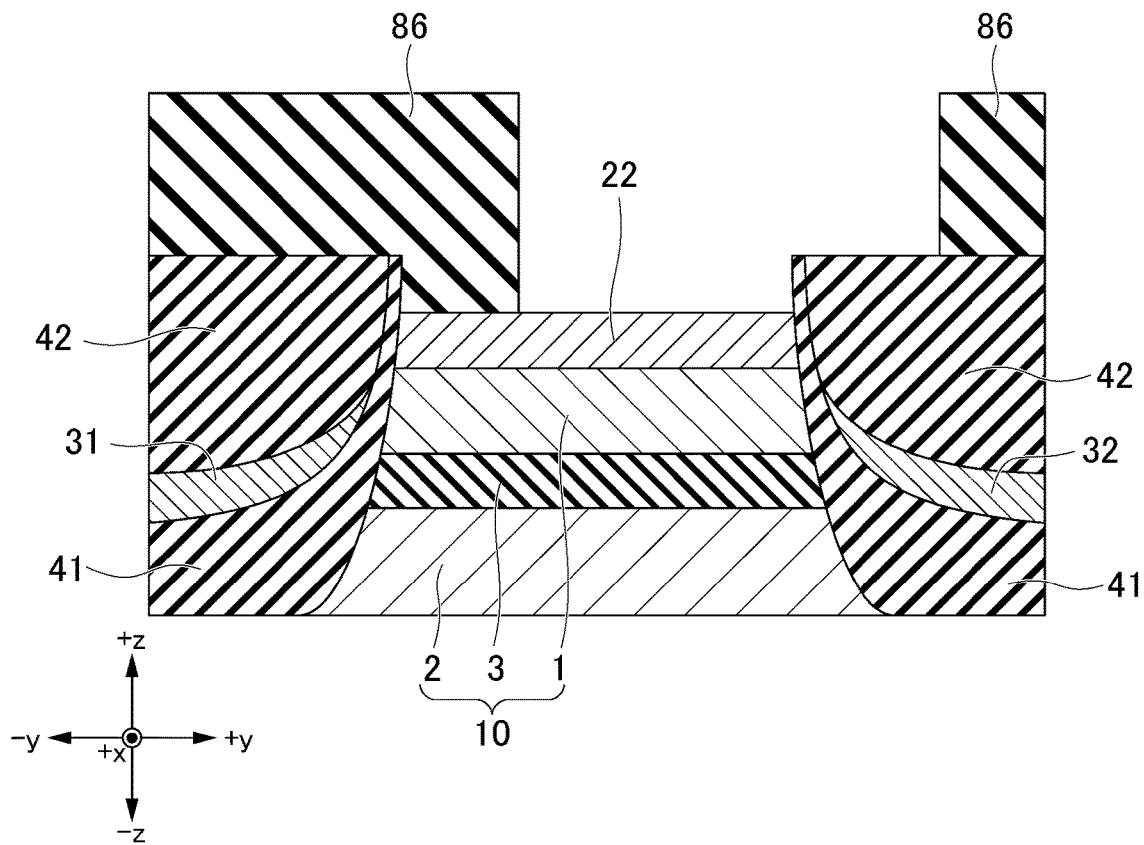
FIG. 6 is a cross-sectional view for describing the method for manufacturing a magnetic element according to the first embodiment.

Next, as illustrated in FIG. 6, the first mask 84 is caused to dissolve and removed. Regarding the first mask 84, a chemical solution is selected in accordance with the material of the first mask 84. When the first mask 84 is removed, a recessed part surrounded by the insulating layer 41 and the wide width portion 22 is formed.

Next, as illustrated in FIG. 6, a resist 86 is formed such that a portion of the recessed part is exposed. Next, a conductive film is formed via the resist 86. The conductive film which is formed at a part where the resist 86 is not formed becomes the wiring portion 21. A surface of the wiring portion 21 in the z direction is, for example, inclined due to a shadow effect by the resist 86. Further, the magnetic element 100 illustrated in FIG. 2 is obtained by covering the wiring portion 21 with the insulating layer 43 after the resist 86 is removed.

Figure 7:
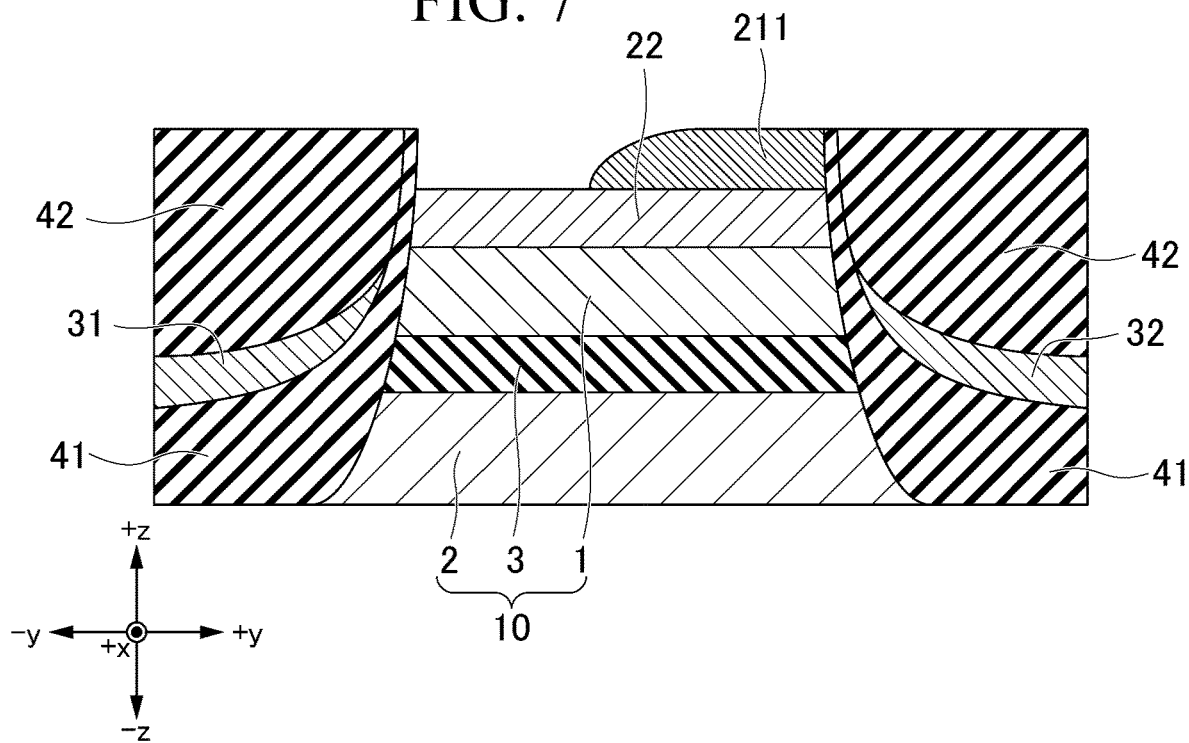
FIG. 7 is a cross-sectional view for describing the method for manufacturing a magnetic element according to the first embodiment.

In addition, as illustrated in FIG. 7, a conductive film 211 may be formed in the recessed part by performing sputtering in an oblique direction inclined with respect to the z direction after the recessed part is formed by causing the first mask 84 to dissolve. The conductive film 211 is formed at a portion of the recessed part by performing sputtering in an oblique direction.

Figure 8:
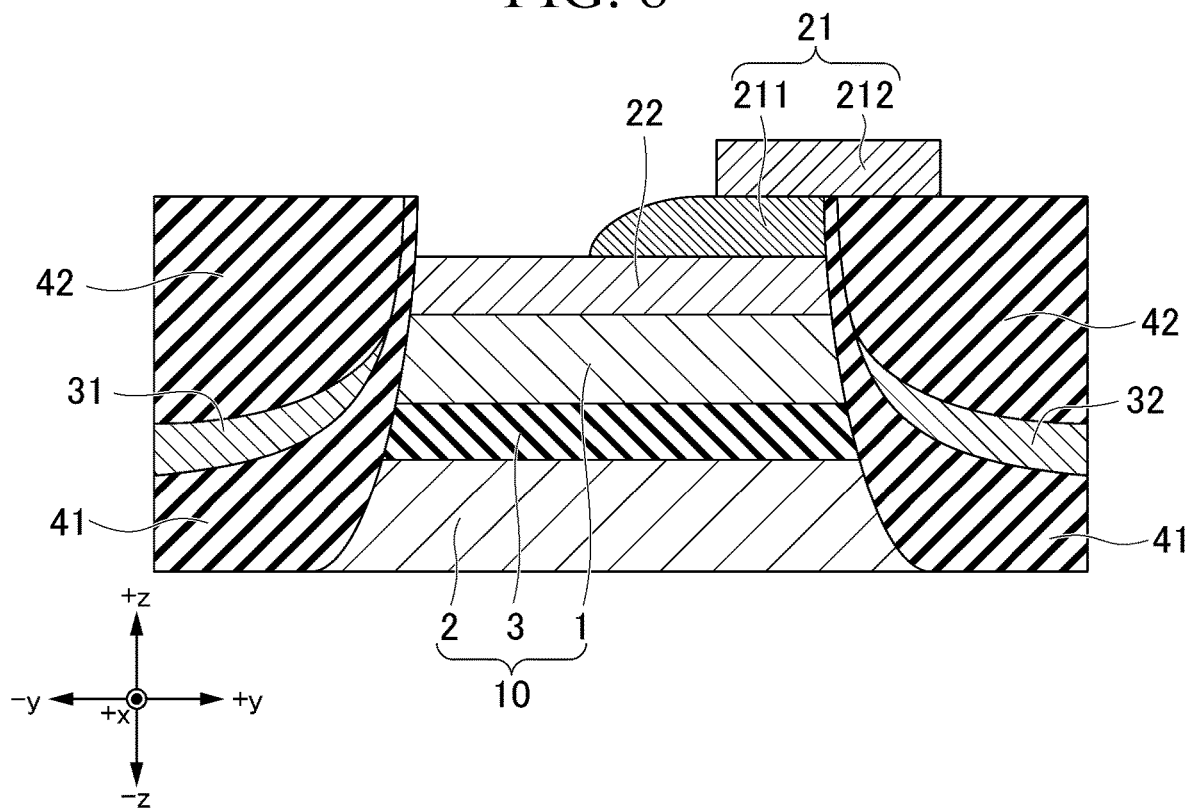
FIG. 8 is a cross-sectional view for describing the method for manufacturing a magnetic element according to the first embodiment.

Next, as illustrated in FIG. 8, a conductive film 212 extending in the x direction is laminated at a position overlapping the conductive film 211. The conductive films 211 and 212 become the wiring portion 21 of the first wiring 20. Further, the magnetic element 100 illustrated in FIG. 2 is obtained by covering the wiring portion 21 with the insulating layer 43.

Next, a function of the magnetic element 100 will be described. The magnetic element 100 can easily reverse the magnetization of the first ferromagnetic layer 1. In addition, the magnetic element 100 can stably perform magnetization reversal without applying an external magnetic field (even in a non-magnetic field environment).

In the magnetic element 100, since a center position of the wiring portion 21 in the y direction and a center position of the first ferromagnetic layer 1 in the y direction are different from each other, the symmetry of the intensity of spins in the y direction implanted into the first ferromagnetic layer 1 is broken. When the symmetry of the intensity of spins in the y direction implanted into the first ferromagnetic layer 1 is broken, the magnetization of the first ferromagnetic layer 1 can be triggered for magnetization reversal, and thus magnetization reversal is facilitated. As a result, magnetization reversal can be realized even in a non-magnetic field environment.

When the current I is applied to the first wiring 20, spins are injected into the first ferromagnetic layer 1. The implanted spins apply a spin-orbit torque to the magnetization of the first ferromagnetic layer 1, and thus magnetization reversal occurs.

The direction of spins implanted into the first ferromagnetic layer 1 from the first wiring 20 is oriented in the y direction. When the magnetization direction of the first ferromagnetic layer 1 is not directed in the y direction, the direction of the implanted spins and the magnetization direction of the first ferromagnetic layer 1 are orthogonal to each other. The implanted spins apply a spin-orbit torque to the magnetization of the first ferromagnetic layer 1. The spin-orbit torque acts such that the magnetization of the first ferromagnetic layer 1 is inclined by 90° from the initial state.

When the intensity of spins implanted into the first ferromagnetic layer 1 is the same at any position in the y direction, theoretically, the probability that the magnetization is reversed from a state inclined by 90° and the probability that the magnetization returns to the initial state are each 50%.

In contrast, when the intensity of spins implanted into the first ferromagnetic layer 1 at each position in the first ferromagnetic layer 1 in the y direction differs, the magnitude of a spin-orbit torque received by the magnetization of the first ferromagnetic layer 1 differs at each position in the y direction. That is, a balance between forces received by the magnetization is disturbed in the y direction.

The magnetization exhibits magnetization reversal while causing precession movement. The precession movement of the magnetization is amplified under the influence of a spin-orbit torque. When the magnitude of a spin-orbit torque received by the magnetization at each position in the first ferromagnetic layer 1 in the y direction differs, the precession movement is disturbed. When the precession movement is disturbed, a balance between the probability that the magnetization is reversed from a state inclined by 90° and the probability that the magnetization returns to the original state is disturbed. As a result, the magnetization is likely to select any one state, and thus magnetization reversal is made stable.

A balance between forces received by the magnetization in the y direction can also be disturbed by applying an external magnetic field, but the magnetic element 100 disturbs the balance between forces in the y direction in terms of a structure.

In addition, the current I flowing in the first wiring 20 rapidly spreads in the y direction while reaching the wide width portion 22 from the wiring portion 21. As a result, the current also has a component of the y direction in the wide width portion 22. When a current flows in the y direction, spins oriented in the x direction are implanted into the first ferromagnetic layer 1. As a result, the balance of the spin-orbit torque received by the magnetization of the first ferromagnetic layer 1 is further disturbed within an xy plane, and thus magnetization reversal of the first ferromagnetic layer 1 is further facilitated.

Hereinabove, an example of the magnetic element 100 according to the first embodiment has been described in detail. However, additions, omissions, replacements, and other changes of the constitution can be made within a range not departing from the gist of the present disclosure.

First Modification Example

Figure 9:
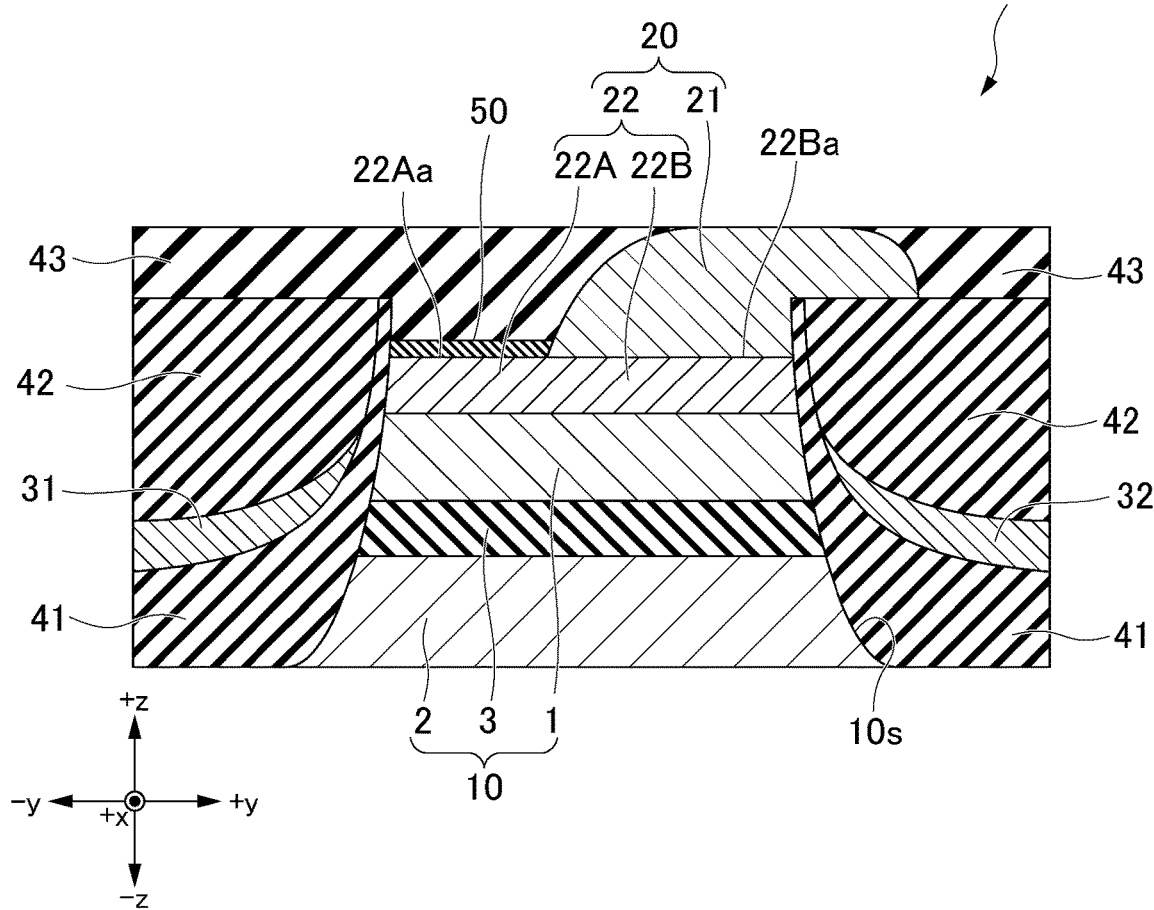
FIG. 9 is a cross-sectional view of a magnetic element according to a first modification example.

FIG. 9 is a cross-sectional view of a magnetic element 101 according to a first modification example. FIG. 9 is a cross-sectional view of the magnetic element 101 cut along a yz plane passing through the center of the magnetoresistance effect element 10 in the x direction. The magnetic element 101 according to the first modification example differs from the magnetic element 100 illustrated in FIG. 2 in having a cap layer 50. Other constitutions are similar to those of the magnetic element 100. Similar reference signs are applied to similar constitutions, and description thereof will be omitted.

The cap layer 50 faces a portion of the wide width portion 22. The cap layer 50 faces a first surface 22Aa of the first region 22A. On the other hand, the cap layer 50 does not face a first surface 22Ba of the second region 22B. When viewed from the z direction, the first region 22A is a part not overlapping the wiring portion 21 of the wide width portion 22, and the second region 22B is a part overlapping the wiring portion 21 of the wide width portion 22. The first surfaces 22Aa and 22Ba are surfaces on a side far from the magnetoresistance effect element 10 of the wide width portion 22.

The cap layer 50 includes any of oxide, nitride, sulfide, and fluoride including an element constituting the wide width portion 22. The cap layer 50 is $Ta_2O_5$, $W_2O_3$, or $HfO_2$. The cap layer 50 may, for example, be a portion of the wide width portion 22 which has been naturally oxidized ted.

In addition, the amount of spin implanted into the first ferromagnetic layer 1 from the first region 22A are smaller than the amount of spin implanted into the first ferromagnetic layer 1 from the second region 22B. It is because the second region 22B comes into contact with the wiring portion 21 and a large amount of current flows. The cap layer 50 forms an interface between the first region 22A and the cap layer 50 and has an effect of increasing the spin current of the first region 22A due to a Rashba effect by this interface. In addition, the cap layer 50 is preferably an insulator and has an effect of causing a spin current generated due to a Rashba effect to be unlikely to flow into the cap layer 50 and mainly increasing a spin current of the first region 22A. Magnetization reversal of the first ferromagnetic layer 1 can be easily performed by increasing the supply amount of spins from the first region 22A into which spins are less likely to be implanted.

In addition, the cap layer may be formed on a surface of the wiring portion 21 in the positive z direction. In this case, the cap layer 50 facing the first region 22A and the cap layer facing the wiring portion 21 differ from each other in height positions in the z direction. The cap layer 50 facing the first region 22A is at a position closer to the first ferromagnetic layer 1 than the cap layer facing the wiring portion 21. Since the cap layer eliminates crystal strain due to the effect of the interface, when the distance between the cap layer and other layers becomes shorter, the effect of enhancing crystallinity increases.

Second Modification Example

Figure 10:
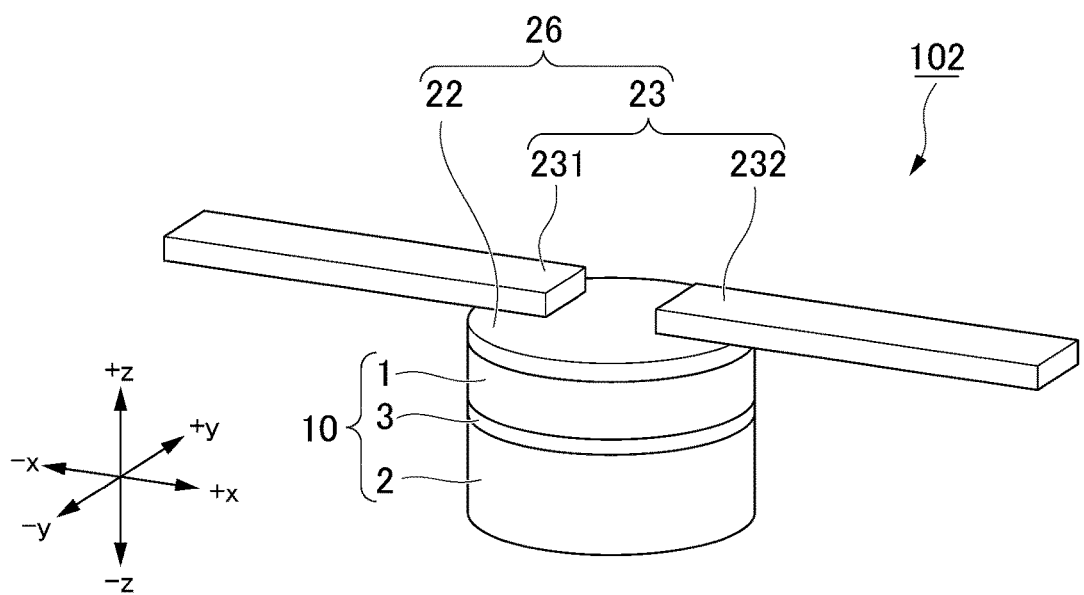
FIG. 10 is a perspective view of a magnetic element according to a second modification example.

FIG. 10 is a perspective view of a magnetic element 102 according to a second modification example. The magnetic element 102 according to the second modification example differs from the magnetic element 100 illustrated in FIG. 1 in that a wiring portion 23 is constituted of two parts separated in the x direction. Other constitutions are similar to those of the magnetic element 100. Similar reference signs are applied to similar constitutions, and description thereof will be omitted.

The magnetic element 102 includes the magnetoresistance effect element 10 and a first wiring 26. The first wiring 26 has the wide width portion 22 and the wiring portion 23. The wiring portion 23 extends in the x direction. The wiring portion 23 has a first part 231 and a second part 232. When viewed from the z direction, the first part 231 and the second part 232 are separated from each other in the x direction at positions overlapping the wide width portion 22. It can be said that the wiring portion 23 is divided into the first part 231 and the second part 232. The first part 231 and the second part 232 are connected to the wide width portion 22.

An current flowing in the first wiring 26 in the x direction flows in the order of the first part 231, the wide width portion 22, and the second part 232 or in the order of the second part 232, the wide width portion 22, and the first part 231. For example, the thickness of the wide width portion 22 in the z direction is smaller than the thicknesses of the first part 231 and the second part 232. The current density in the wide width portion 22 is higher than the current densities in the first part 231 and the second part 232. Since the first part 231 and the second part 232 are separated from each other at positions facing the first ferromagnetic layer 1, the current density of a current flowing in the wide width portion 22 can be increased. A sufficient torque is applied to the magnetization of the first ferromagnetic layer 1 at the time exceeding a predetermined current density, and magnetization reversal is realized. Magnetization reversal of the first ferromagnetic layer 1 can be easily performed by increasing the current density of the wide width portion 22.

Third Modification Example

Figure 11:
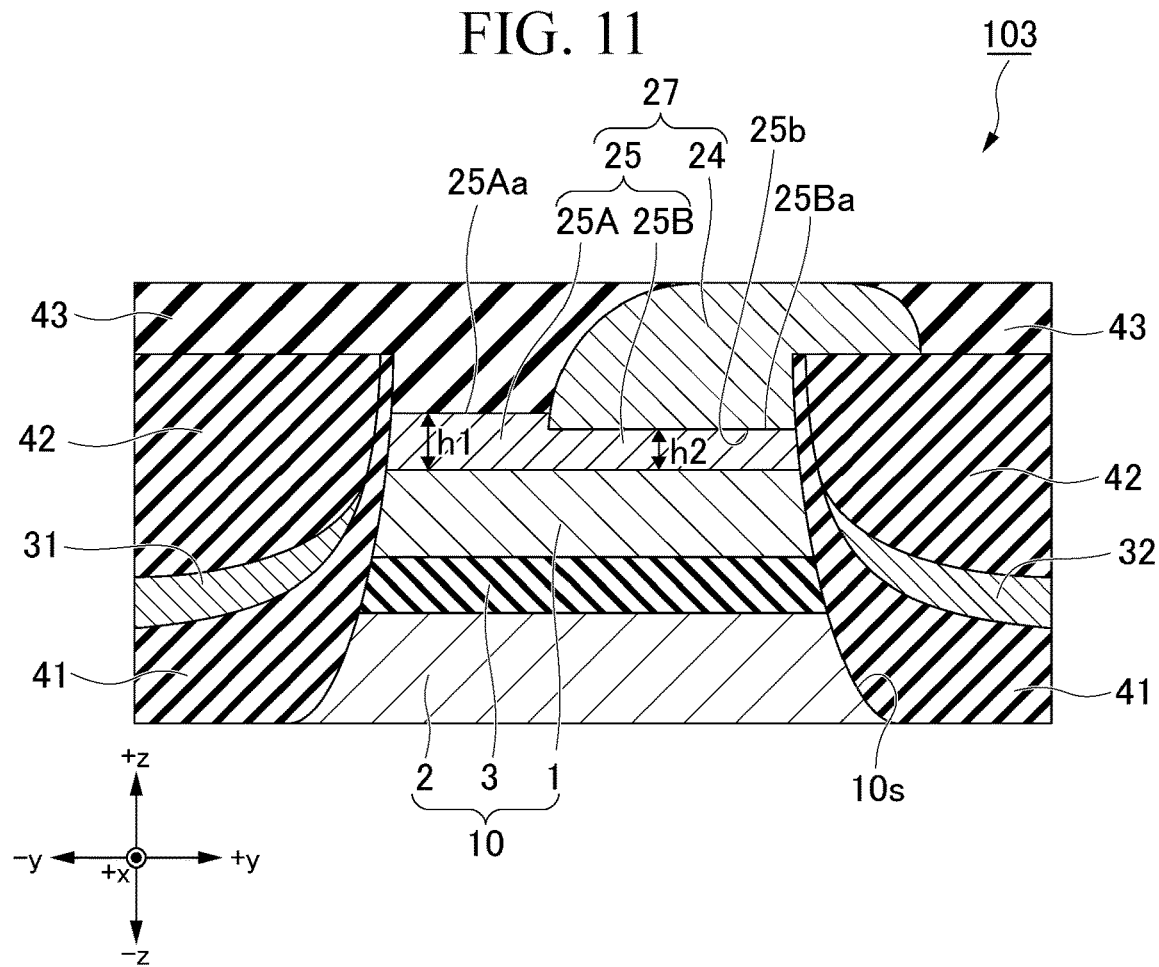
FIG. 11 is a cross-sectional view of a magnetic element according to a third modification example.

FIG. 11 is a cross-sectional view of a magnetic element 103 according to a third modification example. FIG. 11 is a cross-sectional view of the magnetic element 103 cut along a yz plane passing through the center of the magnetoresistance effect element 10 in the x direction. The magnetic element 103 according to the third modification example differs from the magnetic element 100 illustrated in FIG. 2 in that a positional relationship between a wide width portion 25 and a wiring portion 24. Other constitutions are similar to those of the magnetic element 100. Similar reference signs are applied to similar constitutions, and description thereof will be omitted.

The magnetic element 103 includes the magnetoresistance effect element 10 and a first wiring 27. The first wiring 27 has the wiring portion 24 and the wide width portion 25. The wiring portion 24 extends in the x direction. When viewed from the z direction, the wide width portion 25 projects in the y direction beyond the wiring portion 24. The wide width portion 25 includes a first region 25A which does not overlaps on the wiring portion 24 in the z direction, and a second region 25B which overlaps on the wiring portion 24 in the z direction. A first surface 25Aa of the first region 25A is at a position on a side in the positive z direction from a first surface 25Ba of the second region 25B. A thickness h2 of the second region 25B is smaller than a thickness h1 of the first region 25A. The wide width portion 25 has a step in a boundary between the first region 25A and the second region 25B. The step is, for example, formed when a surface oxide film of the wide width portion 22 is removed before the wiring portion 21 in FIG. 6 is laminated.

The wiring portion 24 faces the second region 25B. When the distance between the wiring portion 24 and the first ferromagnetic layer 1 (the thickness h2 of the second region 25B) becomes shorter, the amount of spin supplied from the wiring portion 24 to the first ferromagnetic layer 1 increases.

Fourth Modification Example

Figure 12:
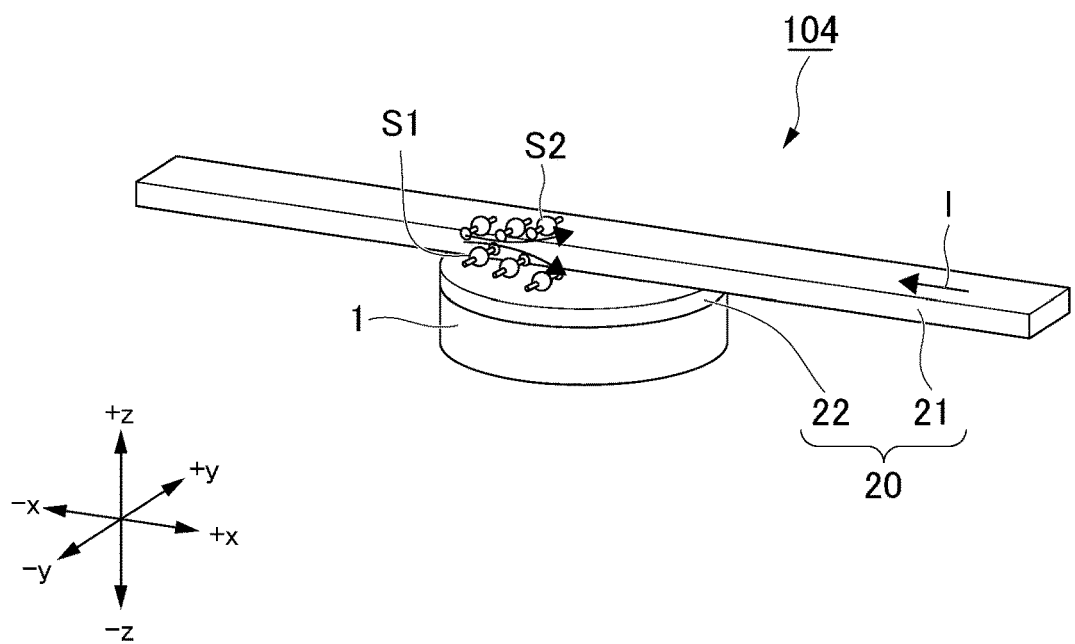
FIG. 12 is a cross-sectional view of a magnetic element according to a fourth modification example.

FIG. 12 is a cross-sectional view of a magnetic element 104 according to a fourth modification example. The magnetic element 104 according to the fourth modification example differs from the magnetic element 100 illustrated in FIG. 1 in that the non-magnetic layer 3 and the second ferromagnetic layer 2 are not provided. Other constitutions are similar to those of the magnetic element 100. Similar reference signs are applied to similar constitutions, and description thereof will be omitted.

The magnetic element 104 can be utilized alone as an anisotropy magnetic sensor, or an optical element utilizing a magnetic Kerr effect or a magnetic Faraday effect.

The magnetic element 104 according to the fourth modification example is constituted by simply excluding the non-magnetic layer 3 and the second ferromagnetic layer 2. Similar to the magnetic element 100, the efficiency of data writing can be enhanced.

Regarding the magnetic element according to the first embodiment, several examples have been presented with specific description. These examples are merely examples of a magnetic element, and the magnetic element is not limited to these examples. For example, a characteristic constitution of the first modification example to the fourth modification example may be combined.

Second Embodiment

Figure 13:
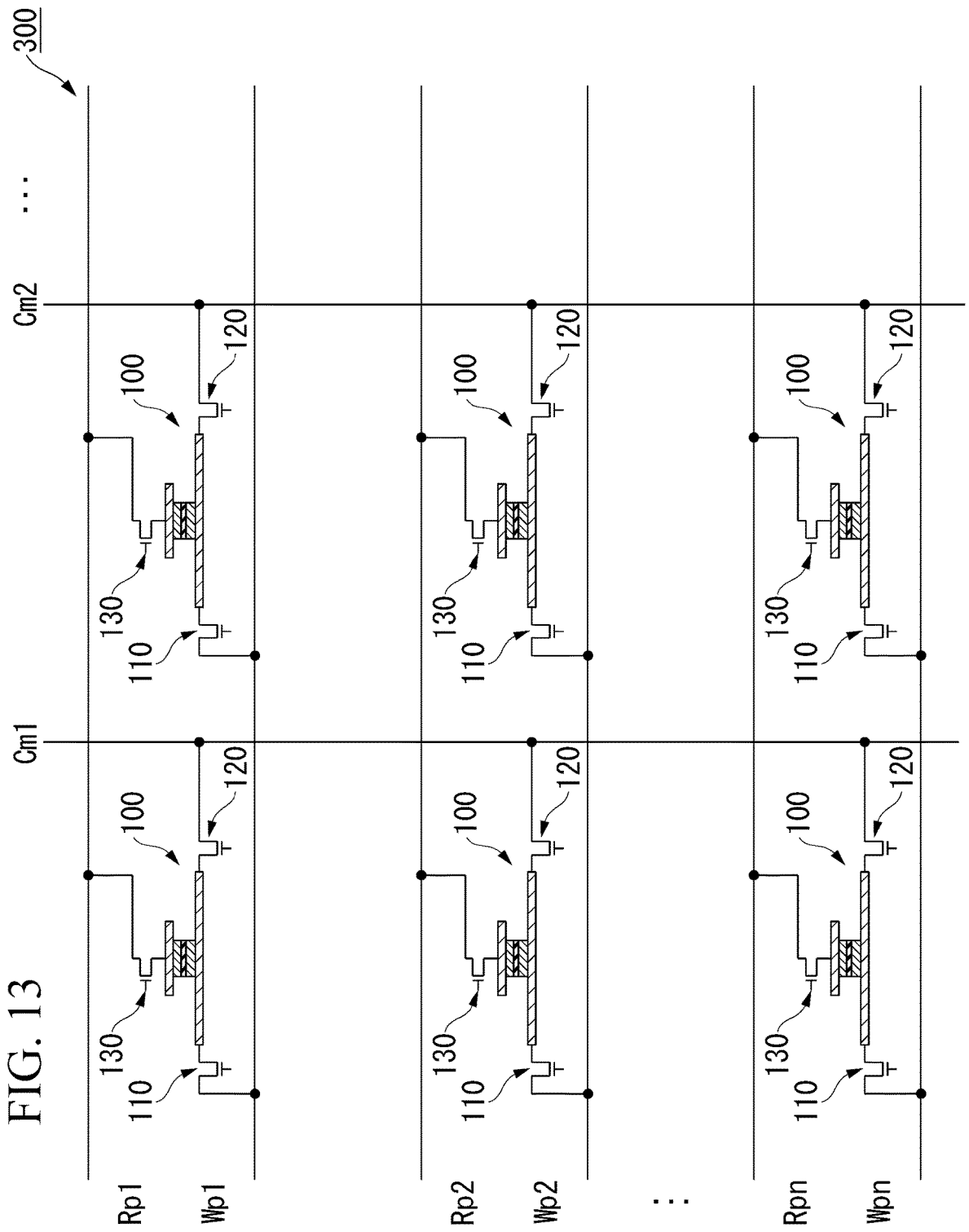
FIG. 13 is a schematic view of a magnetic recording array according to a second embodiment.

The magnetic elements 100, 101, 102, 103, and 104 according to the first embodiment can be used as a magnetic recording array, for example. FIG. 13 is a view of a constitution of a magnetic recording array 300 according to a second embodiment.

The magnetic recording array 300 includes a plurality of magnetic elements 100, a plurality of write wirings Wp1 to Wpn, a plurality of common wirings Cm1 to Cmn, a plurality of read wirings Rp1 to Rpn, a plurality of first switching elements 110, a plurality of second switching elements 120, and a plurality of third switching elements 130. The magnetic recording array 300 can be utilized, for example, in magnetic memories and the like.

The write wirings Wp1 to Wpn electrically connect a power supply to one or more magnetic elements 100. The common wirings Cm1 to Cmn are wirings used at both the time of writing and reading data. The common wirings Cm1 to Cmn electrically connect a reference electric potential to one or more magnetic elements 100. For example, the reference electric potential is a ground potential. The common wirings Cm1 to Cmn may be respectively provided in the plurality of magnetic elements 100 or may be provided across the plurality of magnetic elements 100. The read wirings Rp1 to Rpn electrically connect the power supply to one or more magnetic elements 100. The power supply is connected to the magnetic recording array 300 when in use.

The first switching elements 110, the second switching elements 120, and the third switching elements 130 illustrated in FIG. 13 are respectively connected to the plurality of magnetic elements 100. The first switching elements 110 are respectively connected to places between the magnetic elements 100 and the write wirings Wp1 to Wpn. The second switching elements 120 are respectively connected to places between the magnetic elements 100 and the common wirings Cm1 to Cmn. The third switching elements 130 are respectively connected to places between the magnetic elements 100 and the read wirings Rp1 to Rpn.

When the first switching elements 110 and the second switching elements 120 are turned on, a write current flows between the write wirings Wp1 to Wpn connected to a predetermined magnetic element 100 and the common wirings Cm1 to Cmn. When the second switching elements 120 and the third switching elements 130 are turned on, a read current flows between the common wirings Cm1 to Cmn connected to a predetermined magnetic element 100 and the read wirings Rp1 to Rpn.

The first switching elements 110, the second switching elements 120, and the third switching elements 130 are elements for controlling a flow of a current. The first switching elements 110, the second switching elements 120, and the third switching elements 130 are, for example, transistors, elements utilizing phase change of a crystal layer such as an ovonic threshold switch (OTS), elements utilizing change in band structure such as a metal insulator transition (MIT) switch, elements utilizing a breakdown voltage such as a Zener diode and an avalanche diode, or elements of which conductivity varies in accordance with change in atomic position.

Any of the first switching elements 110, the second switching elements 120, and the third switching elements 130 may be shared with the magnetic elements 100 connected to the same wiring. For example, when the first switching elements 110 are shared, one first switching element 110 is provided on an upstream side of the write wirings Wp1 to Wpn. For example, when the second switching elements 120 are shared, one second switching element 120 is provided on an upstream side of the common wirings Cm1 to Cmn. For example, when the third switching elements 130 are shared, one third switching element 130 is provided on an upstream side of the read wirings Rp1 to Rpn.

Figure 14:
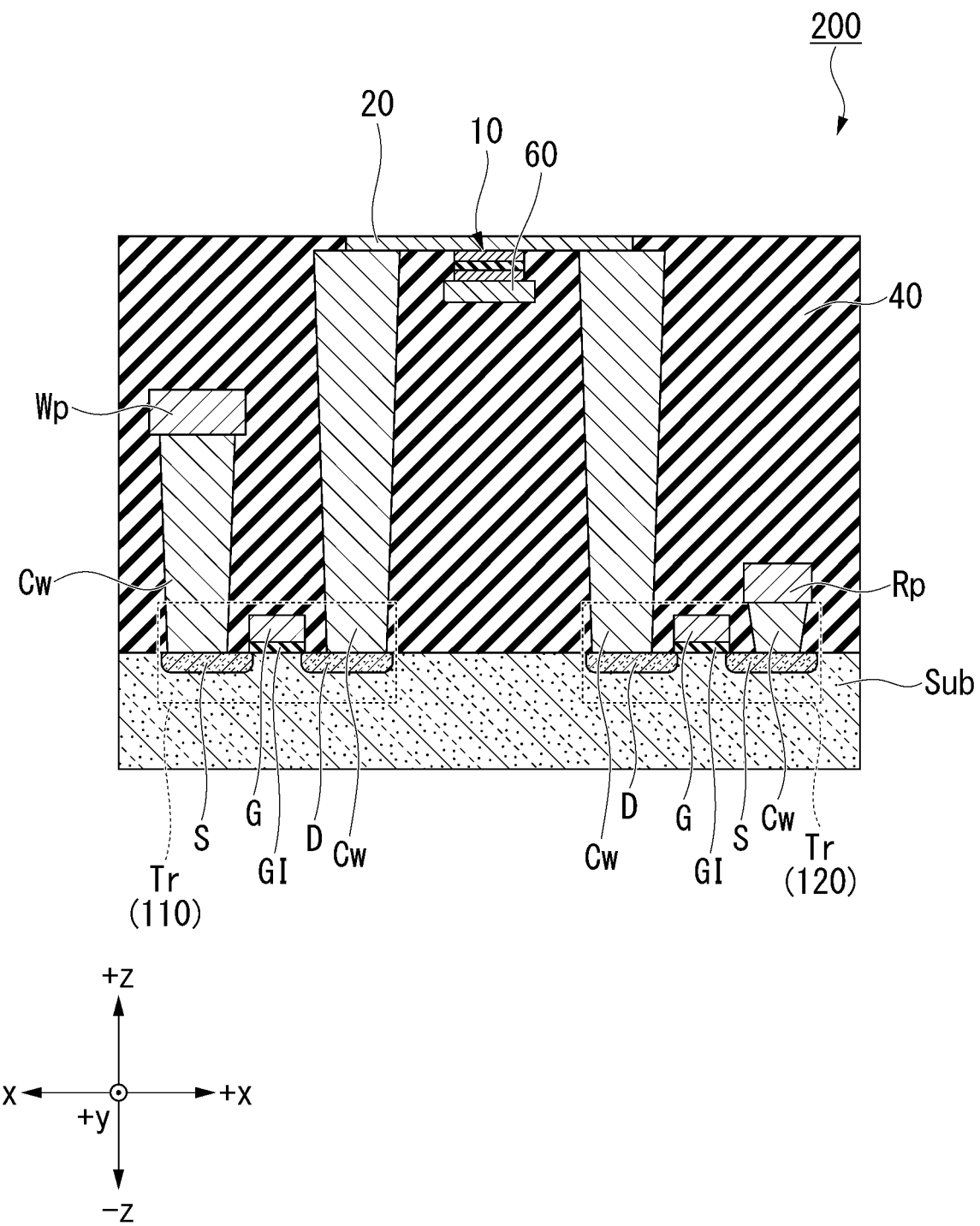
FIG. 14 is a cross-sectional view of a main part of the magnetic recording array according to the second embodiment.

FIG. 14 is a cross-sectional view of a semiconductor device 200 constituting the magnetic recording array 300. FIG. 14 is a cross section of the magnetic element 100 cut along an xz plane passing through the center of the width of the first wiring 20 (which will be described below) in the y direction. The semiconductor device 200 has the magnetic element 100 and a plurality switching elements (the first switching element 110, the second switching element 120, and the third switching element 130) connected to the magnetic element 100. The third switching element 130 is not present in a cross section in illustrated FIG. 14 and is positioned in a paper depth direction (negative y direction), for example. The third switching element 130 is electrically connected to the electrode 60 extending in the y direction. The electrode 60 is a conductor (for example, Cu or Al).

The first switching element 110 and the second switching element 120 illustrated in FIG. 14 are transistors Tr. The transistors Tr have a gate electrode G, a gate insulating film GI, and a source region S and a drain region D formed on a substrate Sub. The substrate Sub is, for example, a semiconductor substrate.

Each of the transistors Tr and the magnetic element 100 are electrically connected to each other via a plurality of via wirings Cw. The via wirings Cw include a conductive material. The via wirings Cw extend in the z direction.

The magnetic element 100 and the transistors Tr are electrically separated from each other by an insulating layer 40 excluding the via wirings Cw. The insulating layer 40 is an insulating layer for insulating wirings or elements from each other in a multi-layer wiring. The insulating layers 41, 42, and 43 are portions of the insulating layer 40.

The magnetic recording array 300 according to the second embodiment includes the magnetic element 100 according to the first embodiment. In each of the magnetic elements 100, magnetization reversal is easily performed, and an inversion current density can be reduced. As a result, power consumption of the magnetic recording array 300 can be reduced. The magnetic element 100 may be a different magnetic element according to the modification examples, for example.

Third Embodiment

The magnetic elements 100, 101, 102, 103, and 104 according to the first embodiment can be used as a reservoir element, for example. The reservoir element is an element used in a reservoir computer that is one of neuromorphic elements. A neuromorphic element is an element which imitates a human brain through a neural network. A neuromorphic element is used as a recognizer, for example. A recognizer recognizes an input image (image recognition) and classifies the input image, for example.

Figure 15:
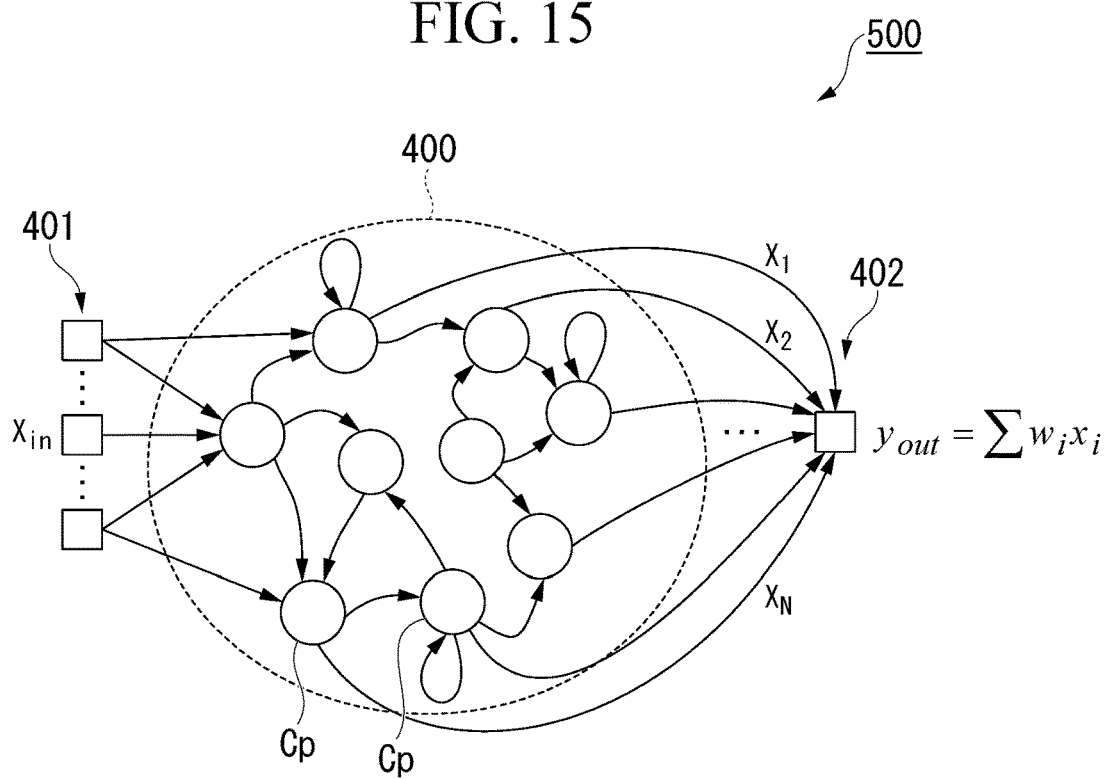
FIG. 15 is a conceptual diagram of a neuromorphic element according to a third embodiment.

FIG. 15 is a conceptual diagram of a neuromorphic element 500 according to a third embodiment. The neuromorphic element 500 has an input unit 401, a reservoir element 400, and an output unit 402. The input unit 401 and the output unit 402 are connected to the reservoir element 400.

The neuromorphic element 500 compresses a signal input from the input unit 401 in the reservoir element 400, performs weighting (learning) with respect to the signal compressed in the output unit 402, and outputs the signal to the outside.

The input unit 401 transmits a signal input from the outside to the reservoir element 400. The input unit 401, for example, includes a plurality of sensors. The plurality of sensors detect information outside the neuromorphic element 500 and inputs the information to the reservoir element 400 as a signal. Regarding the signal, changes in external information over time may be continuously input to the reservoir element 400 or may be divided into predetermined time domains and input to the reservoir element 400.

The reservoir element 400 has a plurality of chips Cp. The plurality of chips Cp perform interaction. A signal input to the reservoir element 400 has a number of pieces of information. A number of pieces of information in a signal are compressed into necessary information through interaction of the plurality of chips Cp. A compressed signal is transmitted to the output unit 402. The reservoir element 400 does not perform learning. That is, the plurality of chips Cp simply interact with each other and do not perform weighting for signals transmitted between the plurality of chips Cp.

The output unit 402 receives a signal from the chips Cp of the reservoir element 400. The output unit 402 performs learning. The output unit 402 performs weighting for each signal from each of the chips Cp through learning. The output unit 402 includes a non-volatile memory, for example. A non-volatile memory is, for example, a magnetoresistance effect element. The output unit 402 outputs a signal to the outside of the neuromorphic element 500.

The neuromorphic element 500 increases the correct answer rate of a question by compressing data in the reservoir element 400 and weighting the data in the output unit 402.

In addition, the neuromorphic element 500 is excellent in power consumption. In the neuromorphic element 500, learning is performed in only the output unit 402. Learning is adjustment of the weight of a signal transmitted from each of the chips Cp. The weight of a signal is determined in accordance with the importance of a signal. When the weight of a signal is frequently adjusted, a circuit between the chips Cp becomes active. When the number of active circuits increases, power consumption of the neuromorphic element 500 increases. The neuromorphic element 500 need only perform learning in only the output unit 402 at the final stage, thereby being excellent in power consumption.

Figure 16:
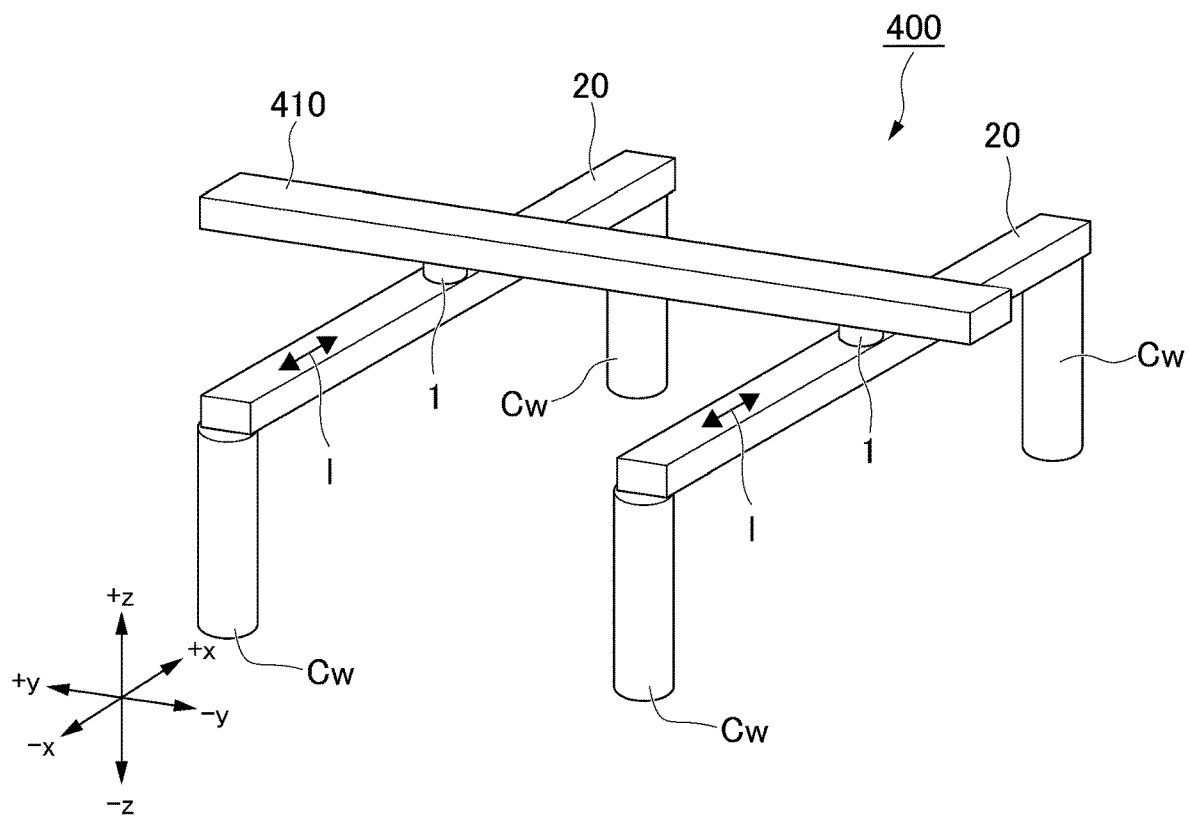
FIG. 16 is a schematic view of a reservoir element according to the third embodiment.

FIG. 16 is a perspective view of the reservoir element according to the third embodiment. The reservoir element 400 includes the via wirings Cw, the first wiring 20, the first ferromagnetic layer 1, and a spin diffusion layer 410.

The spin diffusion layer 410, for example, connects a plurality of first ferromagnetic layers 1 to each other. The spin diffusion layer 410, for example, is constituted of a non-magnetic conductor. The spin diffusion layer 410 propagates a spin current exuded from the first ferromagnetic layer 1.

The spin diffusion layer 410 is, for example, a metal or a semiconductor. A metal used in the spin diffusion layer 410 is, for example, a metal or an alloy including any element selected from the group consisting of Cu, Ag, Al, Mg, and Zn. A semiconductor used as the spin diffusion layer 410 is, for example, a single element or an alloy of any element selected from the group consisting of Si, Ge, GaAs, and C. Examples thereof include Si, Ge, a Si—Ge compound, GaAs, and graphene.

When the current I flows in the first wiring 20, spins are implanted into the first ferromagnetic layer 1, and a spin-orbit torque is applied to the magnetization of the first ferromagnetic layer 1. When a high-frequency current is applied to the first wiring 20, the direction of spins implanted into the first ferromagnetic layer 1 changes, and thus the magnetization of the first ferromagnetic layer 1 vibrates.

A spin current reaches the spin diffusion layer 410 from the first ferromagnetic layer 1. Since the magnetization of the first ferromagnetic layer 1 vibrates, a spin current flowing in the spin diffusion layer 410 also vibrates in a manner corresponding to magnetization. Spins accumulated in an interface between the first ferromagnetic layer 1 and the spin diffusion layer 410 propagate inside the spin diffusion layer 410 as a spin current.

Spin currents individually generated by two magnetizations of the first ferromagnetic layers 1 join together inside the spin diffusion layer 410 and interfere with each other. The interference between spin currents affects vibration of the magnetizations of the first ferromagnetic layers 1, and vibration of the two magnetizations of the first ferromagnetic layers 1 resonates. The vibration phases of the two magnetizations are synchronized or shifted by half a wavelength ($\pi$).

When applying of the current I to the first wiring 20 stops, vibration of the magnetizations of the first ferromagnetic layers 1 stops. The magnetizations of the first ferromagnetic layers 1 after resonance become parallel or antiparallel to each other. When the two vibration phases are synchronized, the directions of the two magnetizations are aligned and become parallel to each other. When the two vibration phases are shifted by half a wavelength ($\pi$), the directions of the two magnetizations become opposite to each other and become antiparallel to each other.

When the two magnetizations of the first ferromagnetic layers 1 are parallel to each other, the resistance value of the reservoir element 400 becomes smaller than in the case of being antiparallel to each other. The reservoir element 400, for example, outputs information of "1" when the resistance value of the reservoir element 400 is large (when two magnetizations are antiparallel to each other) and outputs information of "0" when the resistance value of the reservoir element 400 is small (when two magnetizations are parallel to each other).

The current I input to the first wiring 20 has various kinds of information. Examples thereof include a frequency, a current density, and a current amount of the current I. On the other hand, the reservoir element 400 outputs information of "1" and "0" as the resistance values. That is, the reservoir element 400 according to the first embodiment compresses information by converting vibration of the magnetization of a plurality of first ferromagnetic layers 1 into spin currents and causing the spin currents to interfere with each other inside the spin diffusion layer 410. The first ferromagnetic layers 1 corresponds to the chips Cp in FIG. 15.

The neuromorphic element 500 according to the third embodiment includes the magnetic element 100 according to the first embodiment. Each magnetic element 100 easily performs magnetization reversal, and an inversion current density can be reduced. As a result, power consumption of the neuromorphic element 500 can be reduced. The magnetic element 100 may be a different magnetic element according to the modification examples, for example.

EXPLANATION OF REFERENCES

1 First ferromagnetic layer
1c, 21c Center position
2 Second ferromagnetic layer
3 Nonmagnetic layer
10 Magnetoresistance effect element
20, 26, 27 First wiring
21, 23, 24 Wiring portion
22, 25 Wide width portion
22A, 25A First region
22B, 25B Second region
31 First ferromagnetic substance
32 Second ferromagnetic substance
40, 41, 42, 43 Insulating layer
50 Cap layer
60 Electrode
80, 82 Ferromagnetic layer
81 Nonmagnetic layer
83 Conductive layer
84 First mask
85 Second mask
86 Resist
100, 101, 102, 103, 104 Magnetic element
110 First switching element
120 Second switching element
130 Third switching element
200 Semiconductor device
211, 212 Conductive film
231 First part
232 Second part
300 Magnetic recording array
400 Reservoir element
401 Input unit 402 Output unit
410 Spin diffusion layer
500 Neuromorphic element
w21, w22 Width

What is claimed is:

1. A magnetic element comprising:
a first ferromagnetic layer; and
a first wiring that faces the first ferromagnetic layer in a first direction,
wherein the first wiring includes
a wiring portion extending in a second direction different from the first direction, and
a wide width portion having a wider width than the wiring portion in a third direction intersecting the second direction when viewed from the first direction,
wherein a center position of the wiring portion in the third direction and a center position of the first ferromagnetic layer in the third direction are different from each other,
wherein the wide width portion has a first region which does not overlap with the wiring portion in a plan view in the first direction, and a second region which overlaps with the wiring portion, and
wherein the wiring portion includes a region which overlaps with the first ferromagnetic layer in the plan view.

2. The magnetic element according to claim 1 further comprising:
a cap layer formed on the first,
wherein the cap layer includes one or more selected from the group consisting of oxide, nitride, sulfide, and fluoride including an element constituting the wide width portion.

3. The magnetic element according to claim 1,
wherein a spin resistance of the wide width portion is equal to or lower than a spin resistance of the wiring portion.

4. The magnetic element according to claim 1,
wherein a thickness of the second region is smaller than a thickness of the first region.

5. The magnetic element according to claim 1,
wherein the wiring portion has a first part and a second part which are separated from each other in the second direction when viewed from the first direction.

6. The magnetic element according to claim 1 further comprising:
a first magnetic substance and a second magnetic substance that have the first ferromagnetic layer interposed therebetween in at least one of the second direction and the third direction.

7. The magnetic element according to claim 1,
wherein the first wiring includes one or more selected from the group consisting of a metal, an alloy, an intermetallic compound, metal boride, metal carbide, metal silicate, and metal phosphide which is configured to have a function of generating a spin current due to a spin Hall effect occurring when a current flows.

8. The magnetic element according to claim 1 further comprising:
a second ferromagnetic layer that is positioned on a side opposite to the first wiring of the first ferromagnetic layer; and
a non-magnetic layer that is positioned between the first ferromagnetic layer and the second ferromagnetic layer.

9. A magnetic memory comprising:
a plurality of magnetic elements according to claim 1; and
wirings that are respectively connected to the plurality of magnetic elements.

10. A reservoir element comprising:
a plurality of magnetic elements according to claim 1; and
a spin diffusion layer that connects the first ferromagnetic layers of the plurality of magnetic elements.

11. A recognizer comprising:
the reservoir element according to claim 10; and
a plurality of sensors that are configured to input data to the reservoir element.

12. A method for manufacturing the magnetic element according to claim 1, comprising:
a step of forming a mask layer which is configured to be dissolvable in a portion of a lamination film;
a step of processing a lamination film via the mask layer and forming a magnetoresistance effect element;
a step of forming an insulating layer around the mask layer and the magnetoresistance effect element;
a step of removing the mask layer and forming a conductive layer in a portion of a part from which the mask layer is removed; and
a step of forming an insulating material in a portion where the mask layer is removed, except for a portion where the conductive layer is formed.

13. The method for manufacturing a magnetic element according to claim 12,
wherein the mask layer is any one selected from the group consisting of Si, $SiO_2$, $Al_2O_3$, and a resist.

14. The magnetic element according to claim 1,
wherein the first region and the second region are aligned in the third direction.

15. The magnetic element according to claim 1,
wherein the wiring portion further including a region which does not overlap the first ferromagnetic layer in a plan view in the first direction.

16. The magnetic element according to claim 1,
wherein the first region, the second region and the region which does not overlap the first ferromagnetic layer are aligned in the third direction.

17. The method for manufacturing a magnetic element according to claim 12 further comprising:
a step of forming second conductive film in contact with the conductive layer and a part of the insulating layer.

* * * * *